(12) United States Patent
Chen et al.

(10) Patent No.: US 12,044,922 B2
(45) Date of Patent: Jul. 23, 2024

(54) CURVED FULL-ARRAY LED LIGHT PANEL, CURVED BACKLIGHT MODULE AND CURVED LCD

(71) Applicant: MAVEN OPTRONICS CO., LTD., Hsinchu County (TW)

(72) Inventors: Chieh Chen, Palo Alto, CA (US); Chung-Shu Liao, New Taipei (TW); Ping-Lin Wu, New Taipei (TW)

(73) Assignee: MAVEN OPTRONICS CO., LTD., Hsinchu County (TW)

( * ) Notice: Subject to any disclaimer, the term of this patent is extended or adjusted under 35 U.S.C. 154(b) by 0 days.

(21) Appl. No.: 17/741,253

(22) Filed: May 10, 2022

(65) Prior Publication Data

US 2022/0365394 A1 Nov. 17, 2022

(30) Foreign Application Priority Data

May 11, 2021 (TW) .................................. 110116930

(51) Int. Cl.
*G02F 1/13357* (2006.01)
*G02F 1/1335* (2006.01)
(Continued)

(52) U.S. Cl.
CPC .. *G02F 1/133603* (2013.01); *G02F 1/133605* (2013.01); *G02F 1/133608* (2013.01);
(Continued)

(58) Field of Classification Search
CPC ......... G02F 1/133605; G02F 1/133603; G02F 1/133612; G02F 1/133608; H01L 33/62; H01L 27/156; H01L 33/60
See application file for complete search history.

(56) References Cited

U.S. PATENT DOCUMENTS

| 7,658,529 B2 | 2/2010 | Aoki et al. |
| 11,048,110 B2 | 6/2021 | Lee et al. |

(Continued)

FOREIGN PATENT DOCUMENTS

| CN | 101093319 A | 12/2007 |
| CN | 202580960 U | * 12/2012 |

(Continued)

OTHER PUBLICATIONS

Foreign Action other than Search Report on non-Foley case related to US Dtd Jul. 25, 2023.

(Continued)

*Primary Examiner* — Karabi Guharay
(74) *Attorney, Agent, or Firm* — Foley & Lardner LLP

(57) ABSTRACT

A curved full-array LED light panel, a curved backlight module including the curved full-array LED light panel, and a curved LCD including the backlight module are disclosed. The curved full-array LED light panel includes a flexible reflective sheet and a plurality of LED light bars wherein a plurality of LEDs are disposed. The plurality of LED light bars are attached to a sheet-rear side of the flexible reflective sheet alone a direction parallel to the height direction of the full-array LED light panel, and the plurality of LEDs disposed on the LED light bars are exposed from a plurality of openings of the flexible reflective sheet toward an LCD panel. Along a direction parallel to the width direction of the full-array LED light panel, the flexible reflective sheet is deformed to form a curved reflective surface. Each of the LED light bars further comprises a bar-shaped PCB, and a plurality of LED dimming-zone circuits are disposed on the bar-shaped PCB. Full-array local dimming of the curved full-array LED light panel can be achieved by controlling the electric current of the LED dimming-zone circuits.

24 Claims, 18 Drawing Sheets

(51) Int. Cl.
    *H01L 27/15*     (2006.01)
    *H01L 33/62*     (2010.01)
(52) U.S. Cl.
    CPC ...... *G02F 1/133612* (2021.01); *H01L 27/156* (2013.01); *H01L 33/62* (2013.01)

(56)               References Cited

U.S. PATENT DOCUMENTS

2003/0095399 A1    5/2003  Grenda et al.
2008/0284714 A1   11/2008  Wu et al.
2014/0168949 A1*   6/2014  Zhao ................... G02B 6/0021
                                                        362/97.3
2016/0282669 A1*   9/2016  Lee .................. G02F 1/133605

FOREIGN PATENT DOCUMENTS

CN         103123072  A    5/2013
CN         207424462  U    5/2018
CN         213092068  U    4/2021
KR       20120036660  A    4/2012
TW          201308271 A    2/2013
TW           M462330  U    9/2013
TW          201925872 A    7/2019
WO        WO-9528067 A1 * 10/1995   ............. H05B 37/02

OTHER PUBLICATIONS

Foreign Action other than Search Report on non-Foley case related to US Dtd Dec. 28, 2021.

* cited by examiner

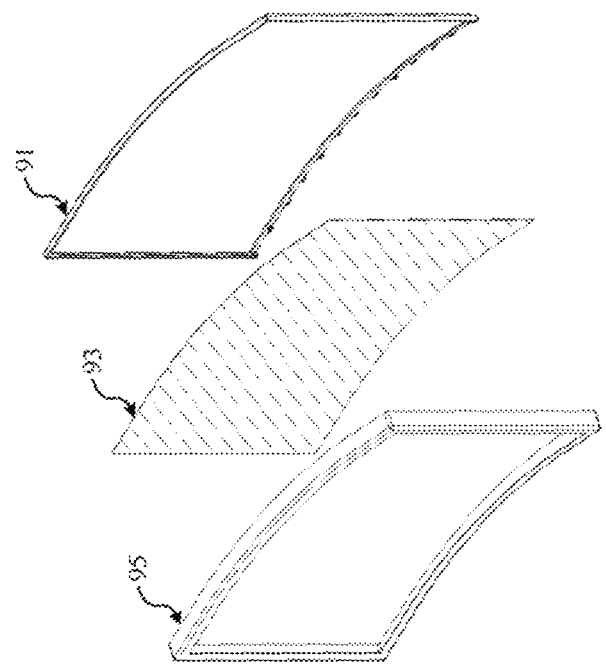
FIG. 1

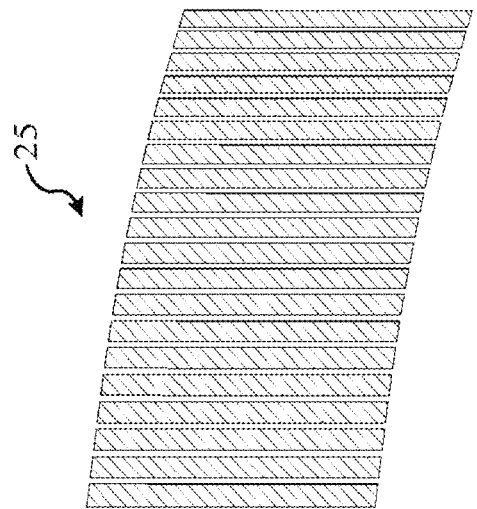
FIG. 10B
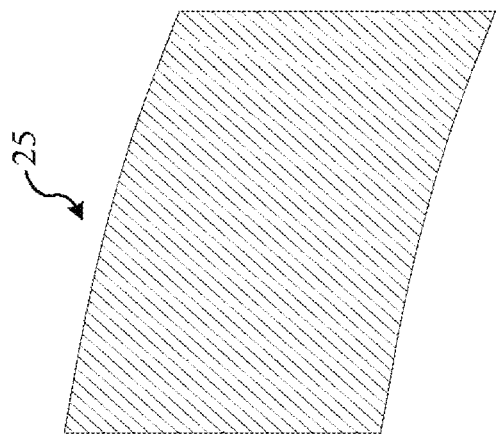
FIG. 10A
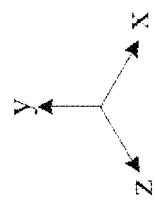

CURVED FULL-ARRAY LED LIGHT PANEL, CURVED BACKLIGHT MODULE AND CURVED LCD

CROSS-REFERENCE TO RELATED APPLICATIONS

This application claims the benefit of and priority to Chinese Patent Application No. 202110513071.1 filed on May 11, 2021, and Taiwan Patent Application No. 110116930 filed on May 11, 2021, the disclosures of which are incorporated herein by reference in their entirety.

BACKGROUND

Technical Field

The present disclosure relates to a light-emitting device (LED) light panel, an LED backlight module and a Liquid Crystal Display (LCD). More specifically, the embodiments of the present disclosures relate to a curved full-array LED light panel, a curved full-array LED backlight module, and a curved LCD.

Description of the Related Art

Full-Array Local Dimming is a technology that dynamically adjusts the LED brightness of the LED dimming zones in a backlight panel of an LCD display. Specifically, it divides a lighting surface of a direct-lit backlight module into different local LED dimming zones and dynamically adjusts backlight intensity of each local LED dimming zone by different grayscale levels according to the brightness and darkness requirements of the image partition zones corresponding to the local dimming zones, thereby reducing the power consumption of the LCD display, and improving the contrast ratio of the display image. When the image contrast ratio of an LCD is improved, the higher the contrast ratio, the more vivid and the better quality the display is. Specifically, full-array local dimming technology can be adopted to control the luminous intensity of each individual LED separately and independently in the LED backlight module. Moreover, the LEDs in the LED backlight module can also be grouped and divided into a plurality of LED dimming zones, wherein the LEDs inside each LED dimming zone is simultaneously controlled with a specified grayscale level of brightness. Thus, when more LED dimming zones are specified in a full-array local dimming display, the surface area of each of the LED dimming zone is smaller, and the image contrast ratio is higher. With a proper design of the number of LED dimming zones for a full-array local dimming backlight module, the image contrast ratio of the LCD can reach up to 1,000,000:1.

In order to realize a conventional flat-panel LCD with full-array local dimming, e.g., a flat-panel LCD with a flat-panel LED backlight module, a non-flexible Printed Circuit Board (PCB), e.g., a flat-panel PCB, is usually adopted to implement the LED light panel for the LED backlight module. The LEDs disposed on the front side of the non-flexible PCB are divided into a plurality of LED dimming zones. Driving circuits can be disposed on the rear side of the PCB to individually and independently control the plurality of LED dimming zones.

Compared with a flat-panel LCD, a curved LCD can provide a more realistic viewing experience, reduce image distortion, relax the viewer's eyes, and have a wider perceptual field of view. Therefore, curved LCDs have been widely adopted in medium-sized LCD monitors, or a large-sized LCD TV. Conventionally, curved edge-lit LED light bars and curved light guide plates are used as backlight modules inside curved LCDs. Since full-array local dimming is a technology which can only be implemented in direct-lit backlight modules, full-array local dimming cannot be implemented in edge-lit backlight modules for curved LCDs. If a flexible PCB is used as a full-array local dimming backlight panel required for a curved LCD monitor or a curved LCD TV, because a required backlight surface area is relatively large, the cost of the flexible PCB will be very high. Moreover, due to a design requirement that the curved LCD is straight along the height direction, the direct-lit backlight module only needs to form a curved surface along the width direction. In other words, the curved display only requires a one-dimensional curved surface along the width direction while maintaining straight along the height direction of the curved LCD. However, the flexible PCB can easily be deformed to a two-dimensional curved surface simultaneously along the height direction and along the width direction. Thus, the rigidity and the mechanical strength of the flexible PCB along the height direction may not be enough to support physical weight of electronic components for local dimming circuits, wherein the PCB is required to maintain straight along the height direction, thus making the assembly process of the backlight module more difficult. Considering the costs and the mechanical strength, the flexible PCB is not the best choice to implement a curved full-array local dimming backlight module. Therefore, there is currently no suitable solution to implement a curved LED backlight module using a full-array local dimming technology to improve the contrast ratio and image quality for a curved LCD.

In view of this, how to improve the above deficiencies by implementing full-array local dimming technology to curved LCDs while providing the industry with solutions that meets market demands with reasonable costs will be an important issue in the technical field of the present disclosure.

SUMMARY

In order to solve at least the above-mentioned problems, the present disclosure provides a curved full-array LED light panel including a plurality of LED light bars and a flexible reflective sheet, wherein each of the plurality of LED light bars may include a bar-shaped PCB and a plurality of LEDs disposed on the PCB-front side of the bar-shaped PCB. The electrical circuits of the bar-shaped PCB on each LED light bar further comprise a plurality of dimming-zone circuits electrically connected in parallel, wherein each dimming-zone circuit is electrically connected with at least one LED so as to adjust the luminous intensity of the at least one LED electrically connected with the dimming-zone circuit, thereby realizing a curved full-array LED light panel with local dimming. The flexible reflective sheet has a plurality of first openings corresponding to the positions of the full array of LEDs. The plurality of LED light bars are attached to the sheet-rear side of a flexible reflective sheet through an adhesive along a height direction of the flexible reflective sheet, and the plurality of LEDs disposed on the plurality of LED light bars are exposed through the plurality of first openings of the flexible reflective sheet toward an LCD panel. Along a width direction of the flexible reflective sheet, the sheet-rear side of the flexible reflective sheet is deformed toward the sheet-front side of the flexible reflective sheet to form a curved reflective surface of the curved full-array LED light panel.

In order to solve at least the above problems, the present disclosure also provides a curved full-array LED backlight module, wherein the curved full-array LED backlight module includes the above curved full-array LED light panel, an optical film stack, and a rear frame, wherein the optical film stack is disposed on the sheet-front side of the flexible reflective sheet, and the rear frame provides spacing for accommodating the optical film stack and the curved full-array LED light panel.

In order to solve at least the above-mentioned problems, the present disclosure further provides a curved LCD, wherein the curved LCD include a curved LCD panel, the above curved full-array LED backlight module, and a front frame. The curved full-array LED backlight module is used to provide a light source required by the curved LCD panel. The front frame is used as housing for accommodating the curved LCD panel, and is mechanically connected with the rear frame during assembly of the curved full-array LED backlight module.

As in the disclosed embodiments, the curved full-array LED light panel disclosed according to the present disclosure includes a flexible reflective sheet and a plurality of LED light bars that are disconnected to one another, wherein the plurality of LED light bars are attached to the sheet-rear side of the flexible reflective sheet, wherein each LED light bar includes a bar-shaped PCB and a plurality of LEDs disposed on the front side of the bar-shaped PCB, and wherein the plurality of LEDs are exposed from a plurality of first openings of the flexible reflective sheet toward an LCD panel. Specifically, a non-flexible PCB can be chosen to implement the plurality of bar-shaped PCBs. Compared with a flexible PCB, the non-flexible PCB has lower cost. Moreover, non-flexible bar-shaped PCBs have sufficient mechanical strength to remain straight along the height direction so as to support weight of the electronic components for the electrical circuit disposed on the PCB required to realize full-array local dimming. The curved full-array LED light panel, the curved full-array LED backlight module, and the curved LCD according to the present disclosure provide embodiments to realize curved displays with good benefits such as good contrast ratio through full-array local dimming while the manufacturing costs are reasonable.

Other aspects and embodiments of the disclosure are also contemplated. The foregoing summary and the following detailed description are not meant to restrict the disclosure to any particular embodiment but are merely meant to describe some embodiments of the disclosure.

BRIEF DESCRIPTION OF THE DRAWINGS

FIG. 1 is an exploded view of a curved LCD according to some embodiments of the present disclosure.

FIG. 10A illustrates a continuous thermally-conductive adhesive tape in accordance with certain embodiments of the present disclosure; and FIG. 10B illustrates disconnected bar-shaped thermally-conductive adhesive tape in accordance with certain embodiments of the present disclosure.

DETAILED DESCRIPTION

Definitions

Figure 2:
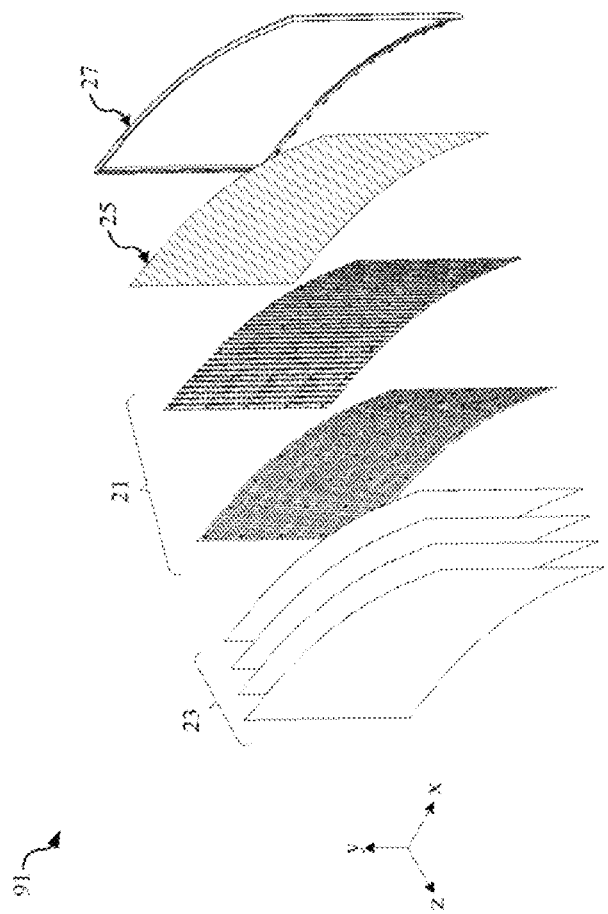
FIG. 2 is an exploded view of a curved full-array LED backlight module according to some embodiments of the present disclosure.

The following definitions apply to some of the technical aspects described with respect to some embodiments of the disclosure. These definitions may likewise be expanded upon herein.

As used herein, the singular terms "a," "an," and "the" may include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, in the description of some embodiments, a component provided "on" or "on top of" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the term "electrically connected" refer to an electrical circuit with a conducting path.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the term "size" refers to a characteristic dimension. In the case of an object (e.g., a particle) that is spherical, a size of the object can refer to a diameter of the object. In the case of an object that is non-spherical, a size of the non-spherical object can refer to a diameter of a corresponding spherical object, where the corresponding spherical object exhibits or has a particular set of derivable or measurable characteristics that are substantially the same as those of the non-spherical object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

Referring to FIG. 1, an exploded view of a curved LCD is illustrated according to some embodiments of the present disclosure. The content shown in FIG. 1 is only used as an example, and is not intended to limit the scope of this disclosure.

As shown in FIG. 1, a curved LCD 1 may include a curved full-array LED backlight module 91, a curved LCD panel 93, and a front frame 95. The curved full-array LED backlight module 91 can be used to provide a planar light source required by the curved LCD panel 93. The front frame 95 can be used to accommodate the curved LCD panel 93, and is mechanically connected with a rear frame inside the curved full-array LED backlight module 91.

The curved LCD panel 93 may be a conventional LCD panel. During a manufacturing process, the LCD panel is assembled by deformation into the front frame 95 and the rear frame of the LED backlight module 91 to form a curved surface. For example, the curved LCD panel 93 may be a Thin-Film-Transistor (TFT) LCD panel. The TFT-LCD panel may typically include a multi-layer structure arranged from the inner side to the outer side including a lower polarizer, a thin-film transistor substrate, a liquid crystal layer, an upper polarizer, a color filter, and the like. When the electric current passes through the transistor on the thin-film transistor substrate, the liquid crystal polymers in the liquid crystal layer can be aligned under the electric field, thereby changing the polarization of light passing through the liquid crystal layer. The upper polarizer is used to determine the bright and dark states of the pixels. In addition, each pixel generally comprises red, green, and blue color filters, which will allow the corresponding three colors of red light, green light and blue light passing through. Thus, these pixels that emit red light, green light and blue light to form a display image.

FIG. 2 is an exploded view of a curved full-array LED backlight module according to some embodiments of the present disclosure. The content shown in FIG. 2 is only used as an example, and is not intended to limit the scope of this disclosure.

As shown in FIG. 2, the curved full-array LED backlight module 91 may include a curved full-array LED light panel 21, an optical film stack 23, a thermally-conductive adhesive tape 25, and a rear frame 27. The mechanical structure of the rear frame 27 is designed to be compatible with the mechanical structure of the front frame 95 of the curved LCD 1, so that both frames can be assembled together to form the curved LCD 1.

As shown in FIG. 2, the curved full-array LED backlight module 91 may include a curved full-array LED light panel 21, an optical film stack 23, a thermally-conductive adhesive tape 25, and a rear frame 27. The mechanical structure of the rear frame 27 and the mechanical structure of the front frame 95 of the curved LCD 1 are compatible with each other.

The optical film stack 23 may include a Quantum Dot Enhancement Film (QDEF), a Brightness Enhancement Film (BEF), a diffuser film, or a combination thereof. The QDEF can convert the backlight provided by the curved full-array LED light panel 21 into a white light. For example, the curved full-array LED light panel 21 comprises blue LEDs. The emitted blue light from the blue LEDs can be converted into partial red light and partial green light while passing through the QDEF. The partial blue light, the partially converted red, and the partially converted green light form a white light as backlight for an LCD. Because the white light comprises relatively pure blue light, relatively pure converted green light and relatively pure converted red light, the light transmittance rate through the color filter is improved and the blue-green light crosstalk is reduced. Thus, the QDEF-based backlight module can have better brightness efficacy and wider color gamut. The BEF is an optical film that re-directs light by the principle of refraction and reflection. It is designed to concentrate a light beam travelling toward the front side of the BEF, and recycle and reuse the scattered light beam outside the viewing angle, thus improving the overall brightness and uniformity. Since BEF can enhance the brightness of the backlight source, it is also called a Prism Sheet. The diffuser film can provide a uniform planar light source for the curved LCD 1. Specifically, the diffuser film may comprise scattering particles. When a light beam passes through the diffuser film, it continues passing through two media with different refractive indices. Thus, the light beam will experience multiple phenomena of refraction, reflection and scattering. This creates an effect of optical diffusion.

Figure 3A:
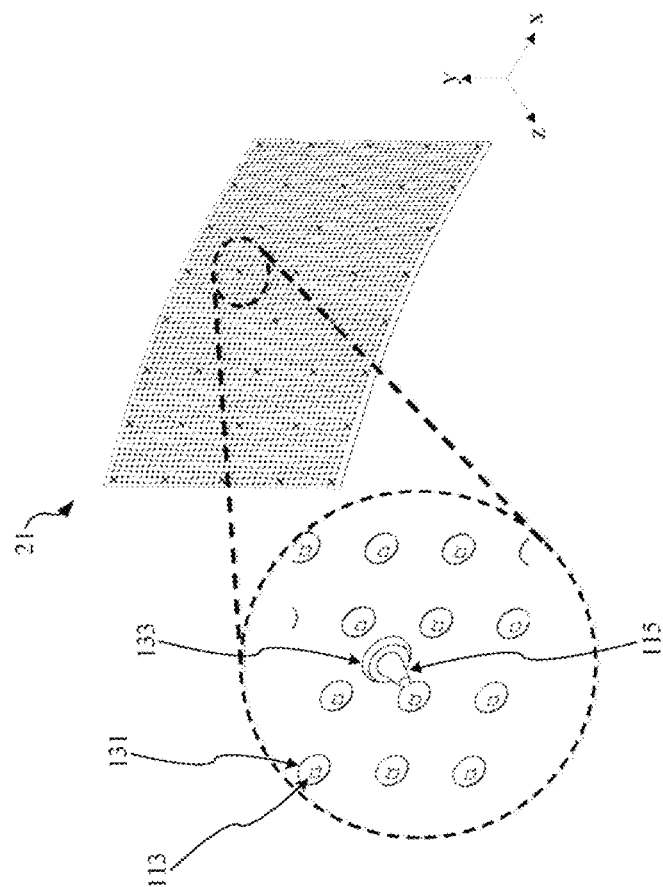
FIG. 3A illustrates a curved full-array LED light panel according to some embodiments of the present disclosure.
Figure 3B:
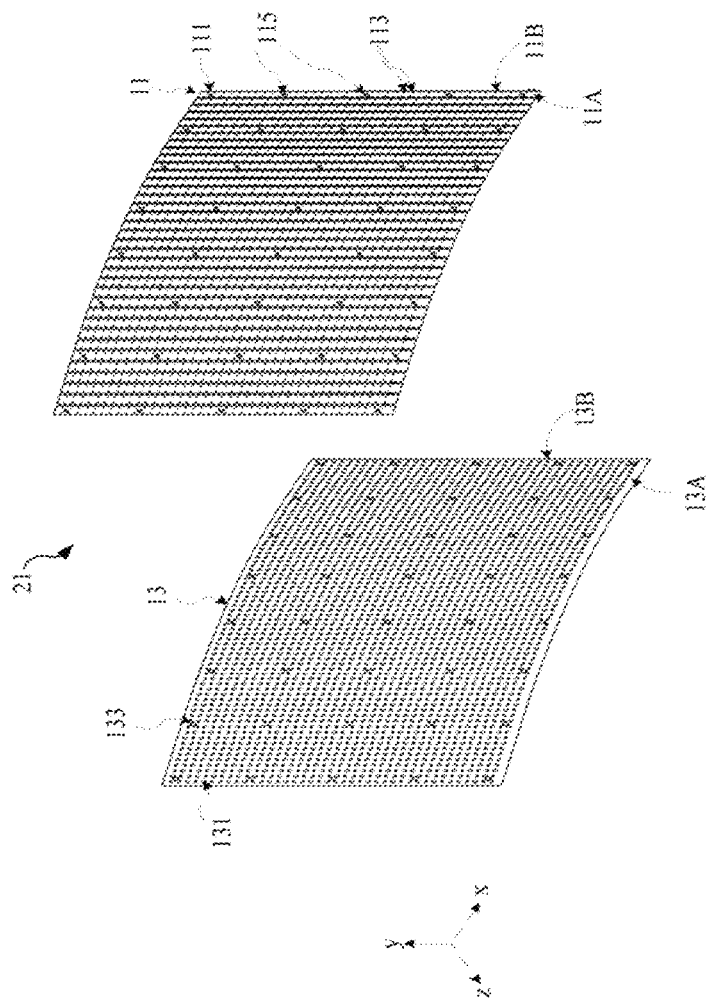
FIG. 3B is an exploded view of the curved full-array LED light panel shown in FIG. 3A.

Reference is made to FIG. 1, FIG. 2, FIG. 3A and FIG. 3B, wherein FIG. 3A illustrates a curved full-array LED light panel according to some embodiments of the present disclosure, and FIG. 3B shows an exploded view of the curved full-array LED light panel illustrated in FIG. 3A. The contents shown in FIG. 3A and FIG. 3B are only used as an example, and are not intended to limit the scope of this disclosure.

As shown in FIG. 3B, the curved full-array LED light panel 21 may include a plurality of LED light bars 11 and a flexible reflective sheet 13. Each LED light bar 11 has a PCB-front side 11A and a PCB-rear side 11B, and each LED light bar 11 includes a bar-shaped PCB 111 and a plurality of LEDs 113 disposed on the PCB-front side 11A of the bar-shaped PCB 111. The flexible reflective sheet 13 comprises the sheet-front side 13A and the sheet-rear side 13B, and includes a plurality of first openings 131 corresponding to the positions of a full array of LEDs. The plurality of first openings 131 may be rectangular openings, circular openings, or openings of other shapes. Referring to FIG. 1, FIG. 2, FIG. 3A and FIG. 3B together, the plurality of LED light bars 11 are respectively attached through an adhesive to the sheet-rear side 13B of the flexible reflective sheet 13 along a height direction (a direction parallel to the y-axis), and the plurality of LEDs 113 disposed on the plurality of the LED light bars 11 are exposed from the plurality of first openings 131 of the flexible reflective sheet 13 toward the curved LCD panel 93 of the curved LCD 1. Along a width direction of the flexible reflective sheet 13 (a direction parallel to the x-axis), the flexible reflective sheet 13 is deformed from the sheet-rear side 13B toward the sheet-front side 13A of the flexible reflective sheet 13 to form a curved reflective surface of the curved full-array LED light panel 21.

As for the thickness of the flexible reflective sheet 13, it can be determined according to specifications of various embodiments. For example, the thickness of a flexible reflective sheet 13 may be not greater than 500 microns, not greater than 300 microns, not greater than 200 microns, or not greater than 100 microns.

The reflectivity of the flexible reflective sheet 13 can be determined according to specifications of various embodiments. For example, the reflectivity of the flexible reflective sheet 13 may be not less than 85%, not less than 90%, or not less than 95%.

The plurality of LEDs 113 disposed on the plurality of LED light bars 11 may comprise one of the followings: blue LEDs, white LEDs converted by photoluminescent materials, purple LEDs, ultraviolet LEDs, or a combination of three-color light sources including red LEDs, green LEDs and blue LEDs arranged alternately. If the plurality of LEDs 113 are blue LEDs, purple LEDs or ultraviolet LEDs, the optical film stack 23 may include a QDEF to convert the primary light into a white light. If the plurality of LEDs 113 are white LEDs converted by photoluminescent materials, or a combination of three-color light sources including red LEDs, green LEDs and blue LEDs arranged alternately, the optical film stack 23 may not include a QDEF.

The size of the plurality of LEDs 113 disposed on the plurality of LED light bars 11 may be sub-millimeter. The sub-millimeter sized LEDs are hereinafter referred to as Mini-LEDs. With the advantage of lower power consumption of Mini-LEDs, the use of full-array Mini-LEDs can increase the luminous intensity of the curved full-array LED light panel 21, achieving the full-screen brightness to greater than 1,000 nits, and the partial-screen brightness to greater than 2,000 nits. In addition, more dimming zones of the LED backlight module can be achieved by using more full-array Mini-LEDs, thereby greatly reducing the power consumption, and improving the contrast ratio of the LCD.

As for the material composition of the bar-shaped PCB 111, it can be determined according to various application specifications. For example, the bar-shaped PCB 111 may be a PCB comprising one of the following composition materials: glass reinforced epoxy resin (FR-4), bismaleimide triazine resin (BT), aluminum, or polyimide. In addition, the bar-shaped PCB 111 may be a non-flexible PCB or a flexible PCB.

Figure 4:
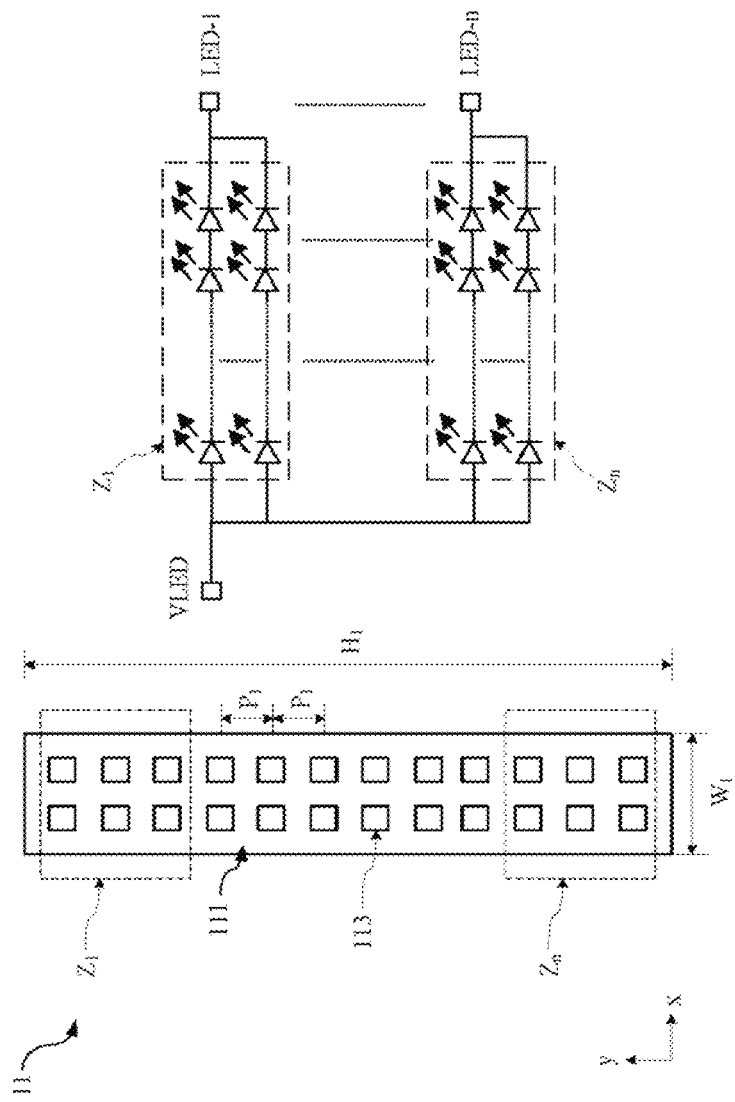
FIG. 4 illustrates a bar-shaped PCB and its electrical circuit diagram of the bar-shaped PCB in a curved full-array LED light panel according to some embodiments of the present disclosure.

Reference is made to FIG. 1, FIG. 2, FIG. 3A, FIG. 3B, and FIG. 4, wherein FIG. 4 illustrates a bar-shaped PCB and its schematic diagram in a curved full-array LED light panel according to some embodiments of the present disclosure. The content shown in FIG. 4 is only used as an example, and is not intended to limit the scope of this disclosure.

As shown in FIG. 4, the electrical circuit of the bar-shaped PCB 111 of each LED light bar 11 further comprises a plurality of LED dimming-zone circuits electrically connected in parallel, and each LED dimming-zone circuit is electrically connected with at least one LED 113. The luminous intensity of the at least one LED can be adjusted by the driving current of the dimming-zone circuit, thereby realizing local dimming of the curved full-array LED light panel 21. For example, the curved full-array LED light panel 21 may include m LED light bars 11 disposed in parallel, and the electrical circuit of the bar-shaped PCB 111 of each LED light bar 11 further comprises n dimming-zone circuits (labeled as $Z_1 \sim Z_n$ in FIG. 4) electrically connected in parallel, each dimming-zone circuit has p LEDs 113 electrically connected, so that the curved full-array LED backlight module 91 comprises a total of m×n×p LED light sources. The number of LED dimming zones m×n of the curved full-array LED backlight module 91 can be specified to be a number between ten zones to ten thousand zones according to application requirements. The p LEDs in each dimming-zone circuit can be electrically connected in series, in parallel, or a combination thereof. The anodes of the LEDs in the plurality of dimming-zone circuits (labeled as $Z_1 \sim Z_n$ in FIG. 4) can be electrically connected with a power supply port VLED in common, and the cathodes of the LEDs in the plurality of dimming-zone circuits can be individually connected with a current-driving signal port (labeled as LED-1~LED-n in FIG. 4).

As shown in FIG. 4, in some embodiments, the LEDs 113 disposed on each LED light bar 11 may be arranged in two columns parallel to each other. In addition, the number of m LED light bars 11 and the geometric ratio of the height $H_1$ to the width $W_1$ of the LED light bars 11 can be determined according to the panel size of the curved LCD panel. For example, the ratio of the height $H_1$ to the width $W_1$ of each LED light bar 11 is not less than 5, not less than 10, or not less than 20. For an example embodiment of a 32-inch curved LCD panel, the height $H_1$ and the width $W_1$ of the LED light bar 11 as shown in FIG. 4 are 406 mm and 16.2 mm, respectively.

Figure 5A:
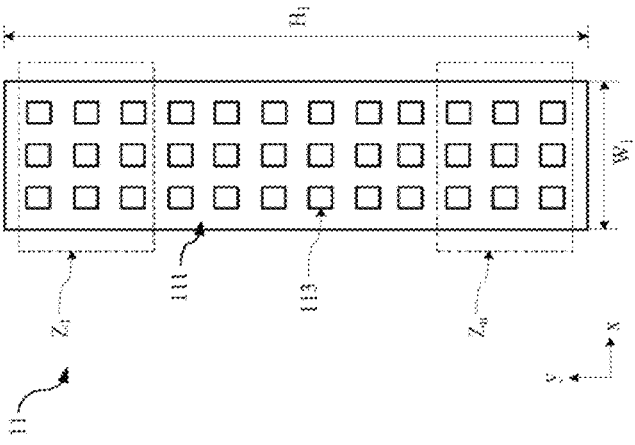
FIG. 5A and FIG. 5B respectively illustrate various embodiments of a bar-shaped PCB in a curved full-array LED light panel according to some other embodiments of the present disclosure.
Figure 5B:
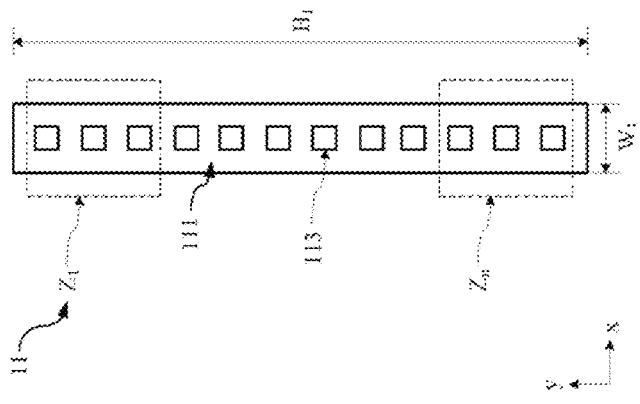

FIG. 5A and FIG. 5B respectively illustrate a bar-shaped PCB and its dimming-zone circuits of an LED light bar 11 in a curved full-array LED light panel according to some other embodiments of the present disclosure. The content shown in FIG. 5A or FIG. 5B is only meant to be an example, and is not intended to limit the scope of this disclosure.

As shown in FIG. 5A, in some embodiments, the LEDs 113 on each LED light bar 11 may be arranged as a single column, and the ratio of the height $H_1$ to the width $W_1$ of each LED light bar 11 is less than 5, not less than 10, not less than 20, or not less than 30. As shown in FIG. 5B, in some embodiments, the LEDs 113 on each LED light bar 11 can also be arranged in three columns parallel to one another, and the ratio of the height $H_1$ to the width $W_1$ of each LED light bar 11 is not less than 5, not less than 10, or not less than 15. In some embodiments, the LEDs 113 on each LED light bar 11 may also be arranged in multiple columns parallel to one another.

Figure 6:
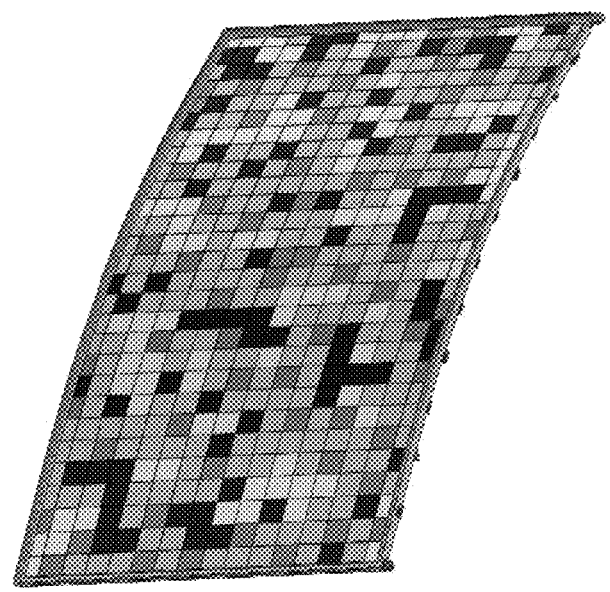
FIG. 6 illustrates a local-dimming grayscale image schematic drawing of a curved full-array LED backlight module according to some embodiments of the present disclosure.

Reference is made to FIGS. 1-5 and FIG. 6, wherein FIG. 6 illustrates a grayscale image schematic drawing of a curved light panel with local dimming provided by a curved full-array LED backlight module according to some embodiments of the present disclosure. In FIG. 6, the full-array LED backlight module of the LCD divides the total display area of an LCD into m×n image zones corresponding to m×n local dimming zones of the backlight module. Grayscale image analysis and calculation are performed according to each image zone of the display image. The luminous intensity level of the corresponding dimming zone in the backlight module is then automatically adjusted to achieve the target grayscale level of the corresponding image zone. In this way, the luminous intensity level for the full-array LED backlight module with local dimming can be adjusted in different image zones of the display image, thus greatly reducing power consumption and improving the display contrast and the picture quality of a full-array local dimming LCD. Compared with a traditional non-local dimmable LCD, its backlight light source is generally in a fully bright state. When displaying a locally darker area within a display image, it can only be achieved by reducing the backlight transmittance through the liquid crystal layer corresponding to the locally darker area. Because the backlight LED is still fully turned on, it is not helpful to reduce power consumption. On the other hand, when displaying a locally darker area within a display image using a full-array local dimming LCD, the luminous intensity of the plurality of LEDs 113 in the corresponding local dimming zones will be dynamically decreased accordingly, thus reducing the overall power consumption of the backlight module. It should be noted that FIG. 6 is illustrated only as an example embodiment, and is not intended to limit the scope of this disclosure.

As described above and illustrated in FIG. 3A and FIG. 3B, the curved full-array LED light panel 21 includes a flexible reflective sheet 13 and a plurality of LED light bars 11 that are not connected to one another, wherein the plurality of LED light bars 11 are attached to the sheet-rear side of the flexible reflective sheet 13. Each LED light bar 11 includes a bar-shaped PCB 111 and a plurality of LEDs 113 disposed on the PCB-front side 11A of the bar-shaped PCB 111. The plurality of LEDs 113 on the bar-shaped PCB 111 are exposed from the plurality of first openings 131 of the flexible reflective sheet 13 toward the curved LCD panel 93 of the curved LCD 1. Through such an arrangement, a non-flexible PCB can be selected as the composition material of a bar-shaped PCB 111 while achieving a desirable curved backlight module. Compared with a planar flexible PCB, a plurality of non-flexible bar-shaped PCBs, arranged in parallel and attached to a flexible reflective sheet, can also form a curvature for a curved backlight module, and has the advantage of lower manufacturing costs. Also, if electronic components of the electrical circuit required for local dimming are disposed on the LED light bar 11 to implement a driver-on-board design, a non-flexible PCB generally has sufficient mechanical strength to support the weight of the LEDs and the electronic semiconductor components required for local dimming. Therefore, the curved full-array LED light panel 21 is advantageous to realize a curved backlight module with full-array local dimming for a curved LCD. In summary, the curved full-array LED light panel 21, the curved full-array LED backlight module 91, and the curved LCD 1 provide embodiments of a curved display with full-array local dimming. Therefore, as illustrated in FIG. 6, through various local dimming algorithms, the curved full-array LED backlight module 91 provides an embodiment of a curved light source with various grayscale-level LED dimming zones according to the display image of the curved LCD 1.

Figure 7:
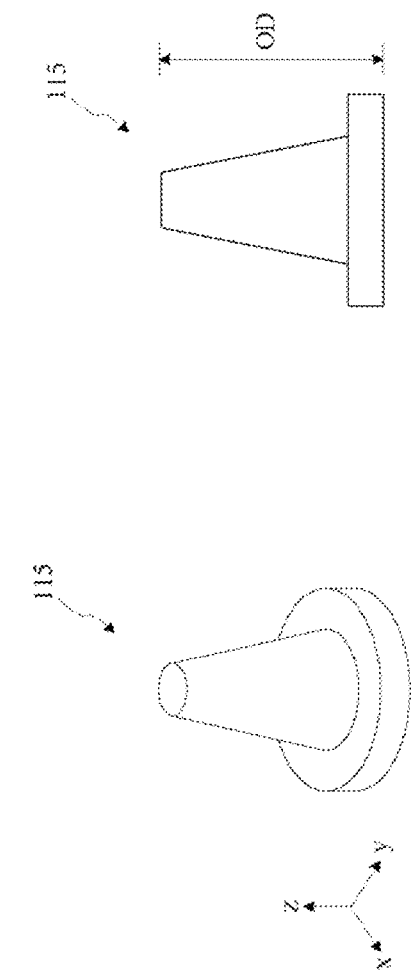
FIG. 7 illustrates a film-support pin for an optical film stack in a curved full-array LED backlight module according to some embodiments of the present disclosure.
Figure 8:
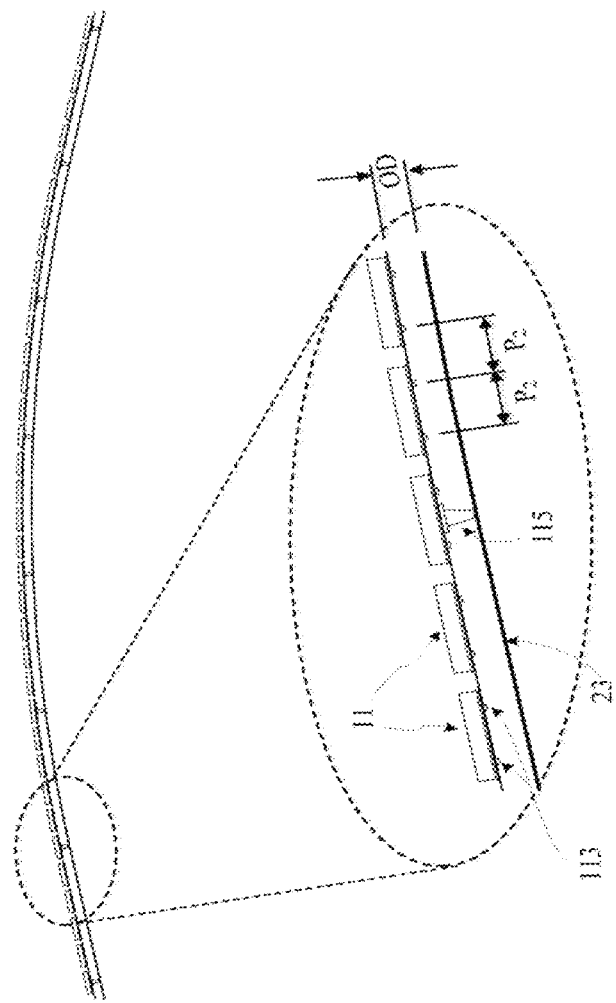
FIG. 8 illustrates an enlarged view of a curved full-array LED backlight module according to some embodiments of the present disclosure.

Reference is made to FIG. 3A, FIG. 3B, FIG. 7, and FIG. 8, wherein FIG. 7 illustrates a film-support pin for an optical film stack in a curved full-array LED backlight module according to some embodiments of the present disclosure, and FIG. 8 illustrates a partially enlarged view of a curved full-array LED backlight module according to some embodiments of the present disclosure. The contents shown in FIG. 7 or FIG. 8 are only examples, and are not intended to limit the scope of this disclosure.

As shown in FIG. 3A, FIG. 3B, FIG. 7 and FIG. 8, in some embodiments according to the present disclosure, the flexible reflective sheet 13 may further include a plurality of second openings 133, and the plurality of LED light bars may further include a plurality of film-support pins 115 for the optical films stack 23. The plurality of second openings 133 may be rectangular openings, circular openings, or openings of other shapes to meet other specifications. The plurality of film-support pins 115 may be disposed on the PCB-front sides 11A of the plurality of bar-shaped PCBs 111 of the plurality of LED light bars 11 and are exposed from the plurality of second openings 133 of the flexible reflective sheet 13 extending toward the curved LCD panel 93 of the curved LCD 1. In addition, the optical film stack 23 is disposed to be in contact with the plurality of film-support pins 115 exposed from the plurality of second openings 133 of the flexible reflective sheet 13. Because the plurality of film-support pins 115 are in contact with the optical film stack 23, an Optical Distance OD is defined between the flexible reflective sheet 13 and the optical film stack 23. In other words, the height of the film-support pin 115 determines the optical distance OD between the flexible reflective sheet 13 and the optical film stack 23. The optical distance OD can be determined according to various design specifications. For example, the optical distance OD may be not greater than 40 mm, not greater than 30 mm, not greater than 20 mm, not greater than 10 mm, not greater than 5 mm, or not greater than 3 mm.

Reference is made to FIG. 4 and FIG. 8. First, as shown in FIG. 4, along the height direction (a direction parallel to the y-axis) of the flexible reflective sheet 13, the plurality of LEDs 113 disposed on the plurality of LED light bars 11 have substantially the same first pitch $P_1$. The distance of the first pitch $P_1$ can be determined according to the height of the curved light panel and the number of LEDs 113. As also shown in FIG. 8, along the curved reflective surface of the flexible reflective sheet 13, the plurality of LEDs 113 of the plurality of LED light bars 11 have substantially the same second pitch $P_2$. The distance of the second pitch $P_2$ can be determined according to the width of the curved full-array LED light panel, the number of LED light bars 11, and the width $W_1$ of the LED light bars 11. The pitch difference between the first pitch $P_1$ and the second pitch $P_2$ can be determined according to the specification of the uniformity requirement of the backlight light source and should be specified as small as possible. That is, the ratio between the first pitch $P_1$ and the second pitch $P_2$ should be desirably close to 1. For example, the ratio between the first pitch $P_1$ and the second pitch $P_2$ may be not greater than 2 and not less than 0.5, not greater than 1.5 and not less than 0.6, or not greater than 1.25 and not less than 0.8.

Figure 9:
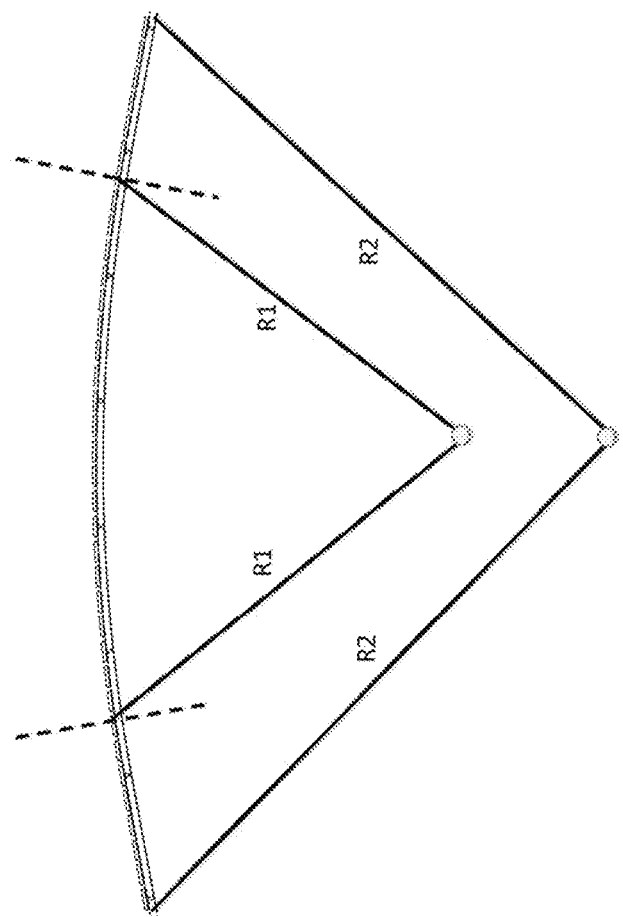
FIG. 9 illustrates a curved LCD with multi curvatures according to some embodiments of the present disclosure.

Reference is made to FIG. 9, which illustrates curvatures of a curved LCD according to some embodiments of the present disclosure. It should be noted that FIG. 9 is only used as an example, and is not intended to limit the scope of this disclosure.

In some embodiments, the LCD 1 can provide a curved display with a single curvature, but in some other embodiments, the LCD 1 can also provide a curved display with multiple curvatures. In one embodiment of the curved LCD 1 with single curvature, the flexible reflective sheet 13 of the curved full-array LED light panel 21 can be formed as a curved reflective sheet with single curvature. In another embodiment of the curved LCD 1 with multiple curvatures, the flexible reflective sheet 13 of the curved full-array LED light panel 21 can be deformed to form a reflective sheet with multiple curvatures. For example, as shown in FIG. 9, the LCD 1 provides a curved surface with two different radii of curvatures, e.g., the first radius of curvature $R_1$ and the second radius of curvature $R_2$, and the flexible reflective sheet 13 of the curved full-array LED light panel 21 can be formed as a curved reflective sheet with the same first radius of curvature and the same second radius of curvature.

Reference is made to FIG. 2, FIG. 3A, FIG. 3B and FIG. 10A, wherein FIG. 10A illustrates a continuous thermally-conductive adhesive tape according to some embodiments of the present disclosure. The content shown in FIG. 10A is only as an example, and is not intended to limit the scope of this disclosure. As shown in FIG. 2, FIG. 3A, FIG. 3B and FIG. 10A, in some embodiments, the PCB-rear sides 11B of the plurality of LED light bars 11 can be attached to the rear frame 27 of the curved full-array LED backlight module 91 through a continuous thermally-conductive adhesive tape 25.

Reference is made to FIG. 2, FIG. 3A, FIG. 3B and FIG. 10B, wherein FIG. 10B illustrates bar-shaped thermally-conductive adhesive tapes that are not connected to one another according to some embodiments of the present disclosure. The content shown in FIG. 10B is only an example, and is not intended to limit the scope of this disclosure. As shown in FIG. 2, FIG. 3A, FIG. 3B and FIG. 10B, in some embodiments, the PCB-rear sides 11B of the plurality of LED light bars 11 can also be respectively attached to the rear frame 27 of the curved full-array LED backlight module 91 through a plurality of disconnected bar-shaped thermally-conductive adhesive tapes 25. In some embodiments, the composition material of the continuous thermally-conductive adhesive tape 25 or the plurality of bar-shaped thermally-conductive adhesive tapes 25 comprises glass fiber fabric. The thermal conductivity of the thermally-conductive adhesive tape 25 can be specified according to various application requirements. For example, the thermal conductivity of the continuous thermally-conductive adhesive tape 25 or the plurality of bar-shaped thermally-conductive adhesive tapes 25 may be not greater than 3.5 W/mK, not greater than 2.5 W/mK, or not greater than 1.5 W/mK.

In some embodiments, the PCB-rear sides 11B of the plurality of LED light bars 11 can also be mounted to the rear frame 27 of the curved full-array LED backlight module 91 through various known securing elements (e.g., screws).

Figure 11A:
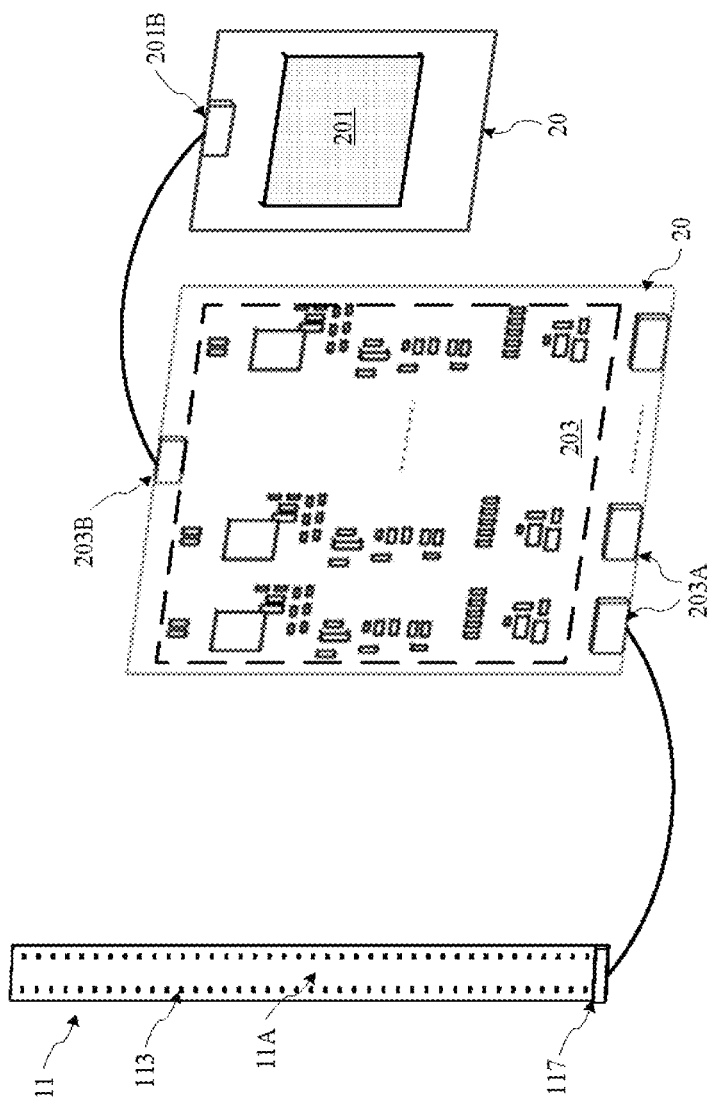
FIG. 11A illustrates an electrical signal and power connection among an LED light bar, a centralized local-dimming driver module, and a local-dimming controller module for a curved full-array LED backlight module according to one embodiment of the present disclosure.
Figure 11B:
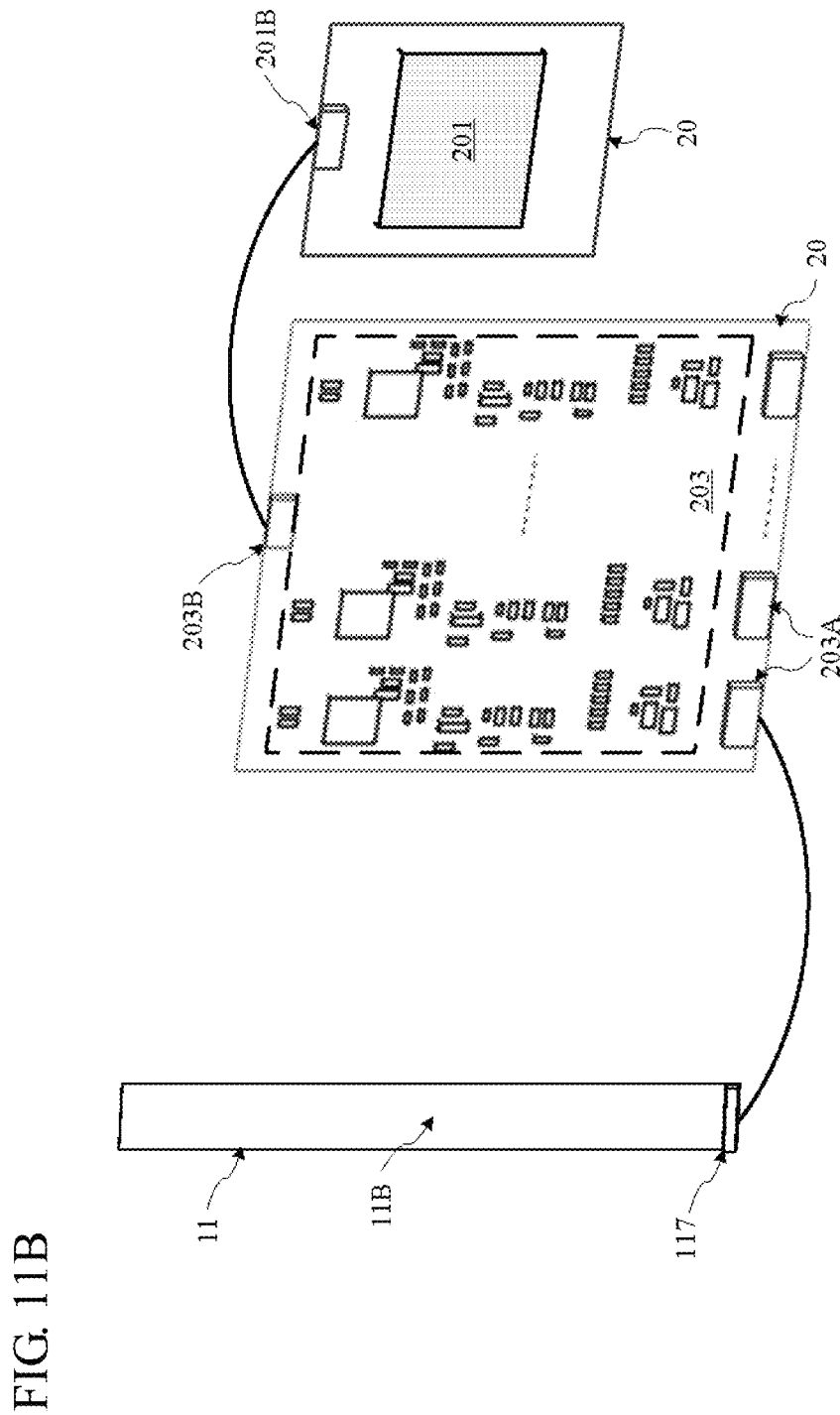
FIG. 11B illustrates an electrical signal and power connection among an LED light bar, a centralized local-dimming driver module, and a local-dimming controller module for a curved full-array LED backlight module according to another embodiment of the present disclosure.

Reference is made to FIG. 11A and FIG. 11B. As shown in FIG. 11A, an LED light bar 11, a centralized local-dimming driver module 203, a local-dimming controller module 201, and power and signal connections among them are illustrated as an embodiment of the curved full-array LED backlight module 91 according to the present disclosure. FIG. 11B illustrates an LED light bar 11, a centralized local-dimming driver module 203, a local-dimming controller module 201, and power and signal connections among them as another embodiment of the curved full-array LED backlight module 91 according to the present disclosure. The contents shown in FIG. 11A or FIG. 11B are only examples, and are not intended to limit the scope of this disclosure.

As shown in FIG. 11A, in some embodiments, the curved full-array LED backlight module 91 includes a main PCB set 20, wherein the main PCB set 20 may further include a local-dimming controller module 201 and a centralized local-dimming driver module 203. The local-dimming controller module 201 individually and independently controls the plurality of dimming-zone circuits disposed on the plurality of bar-shaped PCBs 111 of the plurality of LED light bars 11 by commanding a plurality of target current-driving signals to the centralized local-dimming driver module 203. In addition, the curved full-array LED light panel 21 in the curved full-array LED backlight module 91 further includes a plurality of light-bar connectors 117, wherein the plurality of light-bar connectors 117 are respectively disposed on the PCB-front sides 11A of the plurality of bar-shaped PCBs 111 of the plurality of LED light bars 11, so that the plurality of bar-shaped PCBs 111 can be electrically connected with the main PCB set 20 through the plurality of light-bar connectors 117. More specifically, each light-bar connector 117 can be electrically wired with a driver-board connector 203A on the main PCB set 20, so that the corresponding bar-shaped PCB 111 can be electrically connected through a set of electrical wires to the centralized local-dimming driver module 203. In addition, through another set of electrical wires between the driver-board connector 203B and the controller-board connector 201B on the main PCB set 20, the centralized local-dimming driver module 203 can be electrically connected with the local-dimming controller module 201. The centralized local-dimming driver module 203 and the local-dimming controller module 201 can be disposed separately on a plurality of PCBs of the main PCB set 20 as shown in FIG. 11A, but can also be disposed together on a single PCB of the main PCB set 20 (not shown).

As another variant embodiment shown in FIG. 11B, the curved full-array LED backlight module 91 further includes a main PCB set 20, and the main PCB set 20 includes a local-dimming controller module 201 and a centralized local-dimming driver module 203. However, as shown in FIG. 11B, the plurality of light-bar connectors 117 included in the curved full-array LED backlight module 91 are respectively disposed on the PCB-rear sides 11B of the plurality of bar-shaped PCBs 111 of the plurality of LED light bars 11, instead of being disposed on the PCB-front sides 11A as illustrated in FIG. 11A.

Figure 12A:
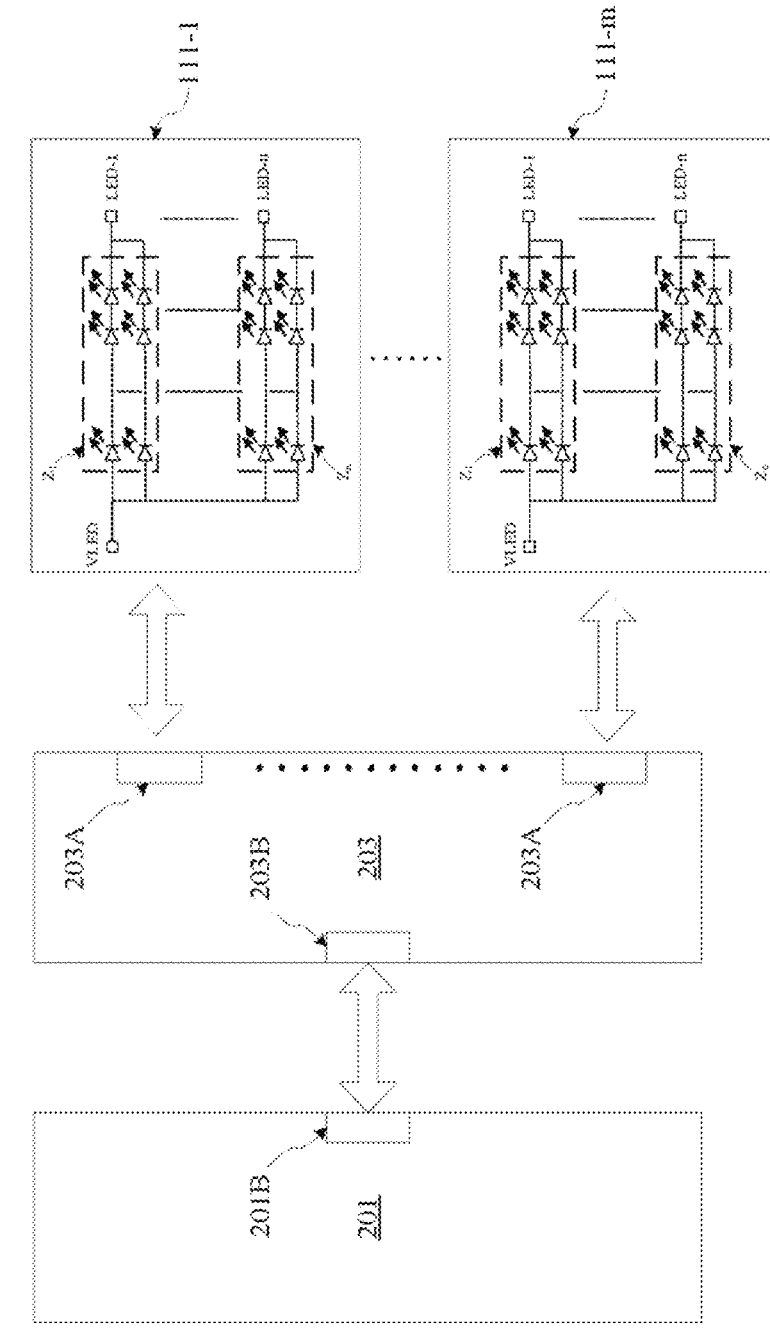
FIG. 12A and FIG. 12B illustrate a configuration of a control architecture with electrical power and signal connections among a local-dimming controller module, a centralized local-dimming driver module, and LED light bars in a curved full-array LED backlight module according to some embodiments of the present disclosure.
Figure 12B:
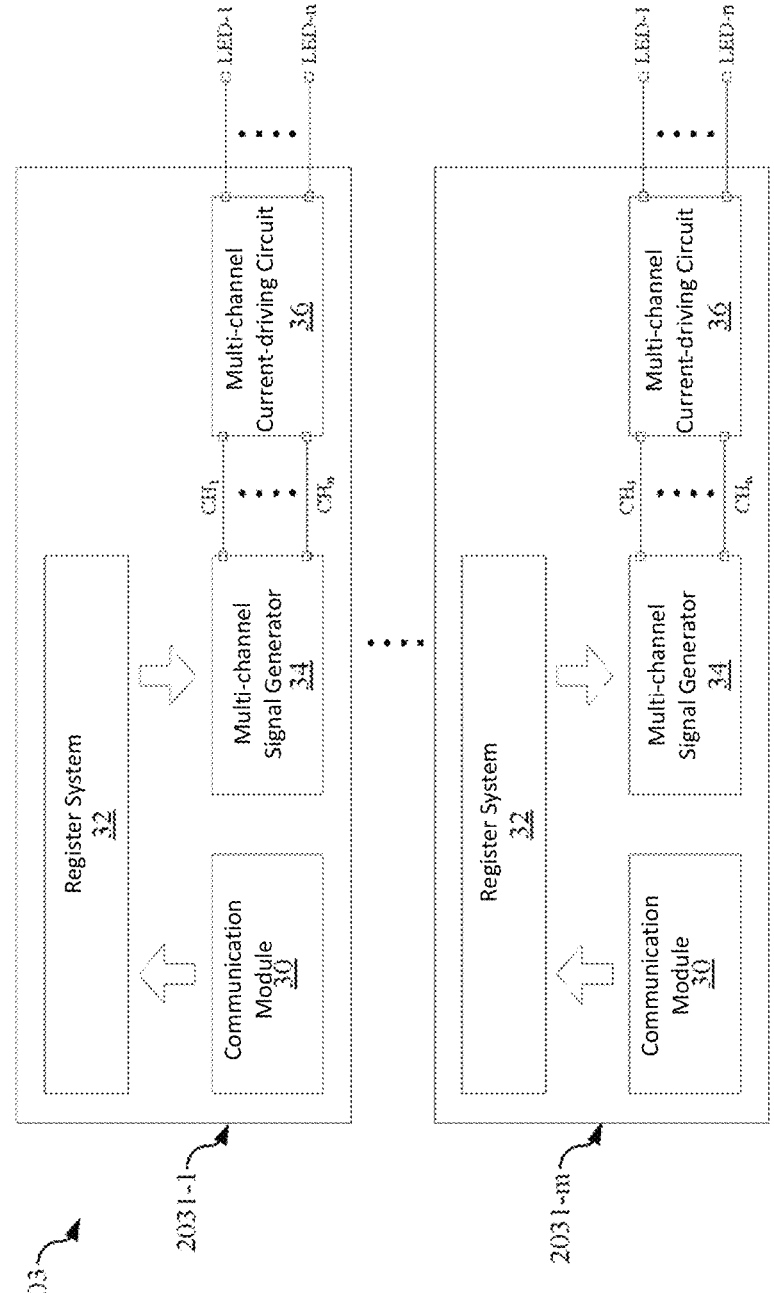

Reference is made to FIG. 11A, FIG. 11B, FIG. 12A and FIG. 12B, wherein FIG. 12A and FIG. 12B illustrate an example configuration of a control architecture with power and signal connections among a local-dimming controller module 201, a centralized local-dimming driver module 203, and LED light bars 111-1~111-$m$ in a curved full-array LED backlight module according to some embodiments of the present disclosure. The contents shown in FIG. 12A and FIG. 12B are only examples, and are not intended to limit the scope of this disclosure.

As shown in FIG. 12A and FIG. 12B, the local-dimming controller module 201 disposed on the main PCB set 20 can be used to analyze the pixel brightness information of each display image when triggered by an image synchronization pulse-train signal. The display image is pre-defined to be partitioned into a plurality of image zones, wherein each image zone has the same size and the corresponding location to the LED dimming zone of the backlight module. Then, the local-dimming controller module 201 can calculate and generate the target dimming-zone brightness information for each LED dimming zone based upon the pixel brightness information of each image zone. Specifically, the calculated target dimming-zone brightness information includes a plurality of dimming-zone brightness grayscale values corresponding to a plurality of LED dimming zones respectively, wherein the plurality of LED dimming zones (e.g., m×n LED dimming zones) correspond to the plurality of LED dimming-zone circuits on each bar-shaped PCB 111 (e.g., n LED dimming zones: $Z_1$~$Z_n$) of the plurality of bar-shaped PCBs 111 of the plurality of LED light bars 11 (e.g., m LED light bars).

Specifically, the local-dimming controller module 201 can be implemented by a microcontroller, or a Microcontroller Unit (MCU). An MCU is a microcomputer that integrates a Central Processing Unit (CPU), memory, timer/counter, and various input and output interface circuits inside an Integrated Circuit (IC) chip. As an example computing sequence of the local-dimming controller module 201, first, the MCU can read the pre-defined image zone definition into its memory. Then, once triggered by an image synchronization pulse-train signal, the MCU can receive the pixel brightness information of the display image. Next, the MCU analyzes the brightness information of each pixel of the image (e.g., the brightness information of R, G, B three colors), digitizes and converts the pixel brightness information into, for example, an 8-bit (0~255) grayscale value for each pixel. According to the pre-defined image zone definition, the brightness data (represented by grayscale values) of all the pixels within the same image zone definition are homogenized to obtain a target homogenized grayscale value for each corresponding LED dimming zone of the backlight module. These target grayscale values for all LED dimming zones are collectively called dimming-zone brightness information. Finally, the MCU transmits the dimming-zone brightness information to the centralized local-dimming driver module 203 in real time when triggered by the image synchronization pulse-train signal.

In FIG. 12A and FIG. 12B, the centralized local-dimming driver module 203 disposed on the main PCB set 20 may include a plurality of sub-systems. For example, there are m sub-systems 2031-1~2031-$m$ illustrated in FIG. 12B, and each sub-system may further include a communication module 30, a register system 32 electrically connected with the communication module 30, and a multi-channel signal generator 34 electrically connected with the register system 32, and a multi-channel current-driving circuit 36 electrically connected with the multi-channel signal generator 34.

The communication module 30 can be used for receiving the dimming-zone brightness information from the local-dimming controller module 201, and storing the dimming-zone brightness information into the register system 32 when triggered by the image synchronization pulse-train signal.

The register system 32 may include a plurality of independent registers, wherein each independent register can be used to respectively store a corresponding dimming-zone brightness information of the LED dimming zones for each LED light bar when triggered by the image synchronization pulse-train signal. As a specific embodiment, each of the independent registers is respectively mapped to a plurality of brightness-data signal ports $CH_1$~$CH_n$ corresponding to the plurality of dimming-zone circuits $Z_1$~$Z_n$ of each bar-shaped PCB 111.

The multi-channel signal generator 34 can be used for generating a plurality of target current-driving signals corresponding to the plurality of dimming-zone circuits for each LED light bar 11 according to the dimming-zone brightness information. For example, the multi-channel signal generator 34 may be a multi-channel Pulse Width Modulation (PWM) signal generator, which converts the dimming-zone brightness information into the duty cycle of a PWM signal (e.g., a target current-driving signal), and the PWM signal is transmitted to the corresponding channel of the multi-channel current-driving circuit 36. Taking an 8-bit digital signal as an example, the definition of the duty cycle of the PWM signal is as follows:

$$D = G/255 \times 100\%$$

wherein D is the duty cycle and G is the dimming-zone brightness information (represented by an 8-bit grayscale value).

The multi-channel current-driving circuit 36 has a plurality of current-driving signal ports (labeled as LED-1~LED-n) respectively corresponding to the plurality of brightness-data signal ports $CH_1$~$CH_n$. The multi-channel current-driving circuit 36 can be used to separately and independently control the driving current of the LEDs 113 of each dimming-zone circuit based upon the values of the plurality of brightness-data signal ports $CH_1$~$CH_n$ generated by the multi-channel signal generator 34, so as to realize local dimming of a full-array backlight module.

Figure 13:
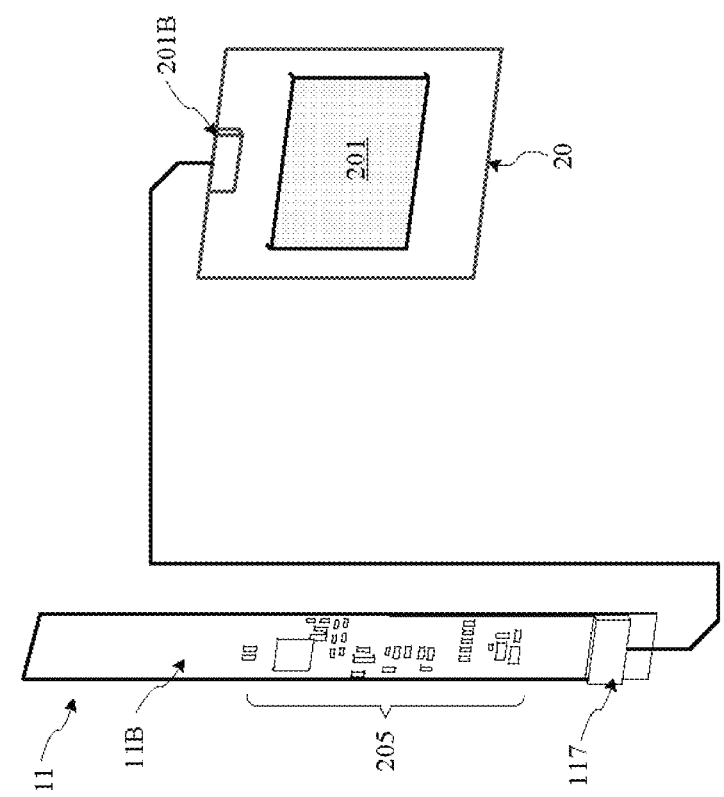
FIG. 13 illustrates a power and signal connection among an LED light bar, a distributed local-dimming driver module, and a local-dimming controller module of a curved full-array LED backlight module according to some embodiments of the present disclosure.

Reference is made to FIG. 13, which illustrates power and signal connections between an LED light bar, a distributed local-dimming driver module and a local-dimming controller module in a curved full-array LED backlight module according to some embodiments of the present disclosure. The content shown in FIG. 13 is only an example, and is not intended to limit the scope of this disclosure.

As shown in FIG. 13, in some embodiments, the curved full-array LED backlight module 91 further includes a main PCB set 20, and the main PCB set 20 includes a local-dimming controller module 201, but does not include a local-dimming driver module as part of the main PCB set 20. Similarly, the curved full-array LED light panel 21 in the curved full-array LED backlight module 91 further includes a plurality of light-bar connectors 117, wherein the plurality of light-bar connectors 117 are respectively disposed on the PCB-rear sides 11B of the bar-shaped PCB 111 of the plurality of LED light bars 11. The curved full-array LED backlight module 91 further includes a plurality of distributed local-dimming driver modules 205, wherein the plurality of distributed local-dimming driver modules 205 are also respectively disposed on the PCB-rear side 11B of the bar-shaped PCB 111 of the plurality of the plurality of LED light bars 11. Thus, each light-bar connector 117 can be electrically connected to the controller-board connector 201B on the main PCB set 20 via a set of electrical wires. That is, the distributed local-dimming driver module 205 on the PCB-rear side 11B of the bar-shaped PCB 111 of the LED light bar 11 can be electrically connected with the local-dimming controller module 201 disposed on the main PCB set 20 via a set of electrical wires. The local-dimming controller module 201 individually and independently controls the plurality of dimming-zone circuits on the plurality of bar-shaped PCBs 111 of the plurality of LED light bars 11 by commanding a plurality of target current-driving signals to the distributed local-dimming driver modules 205.

Figure 14A:
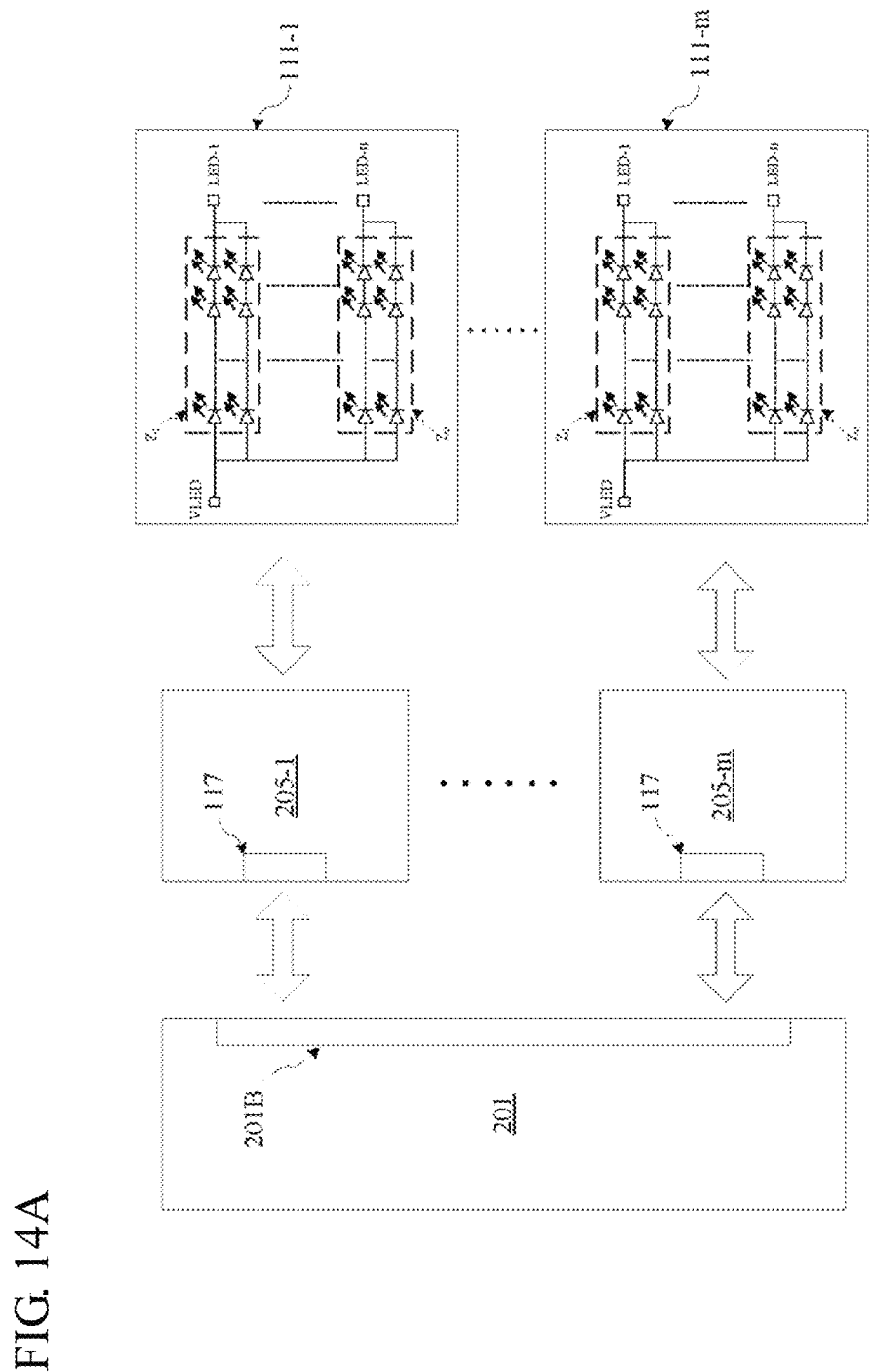
FIG. 14A and FIG. 14B illustrate a configuration of another control architecture with electrical power and signal connections among a local-dimming controller module, a distributed local-dimming driver module, and LED light bars in a curved full-array LED backlight module according to some embodiments of the present disclosure.
Figure 14B:
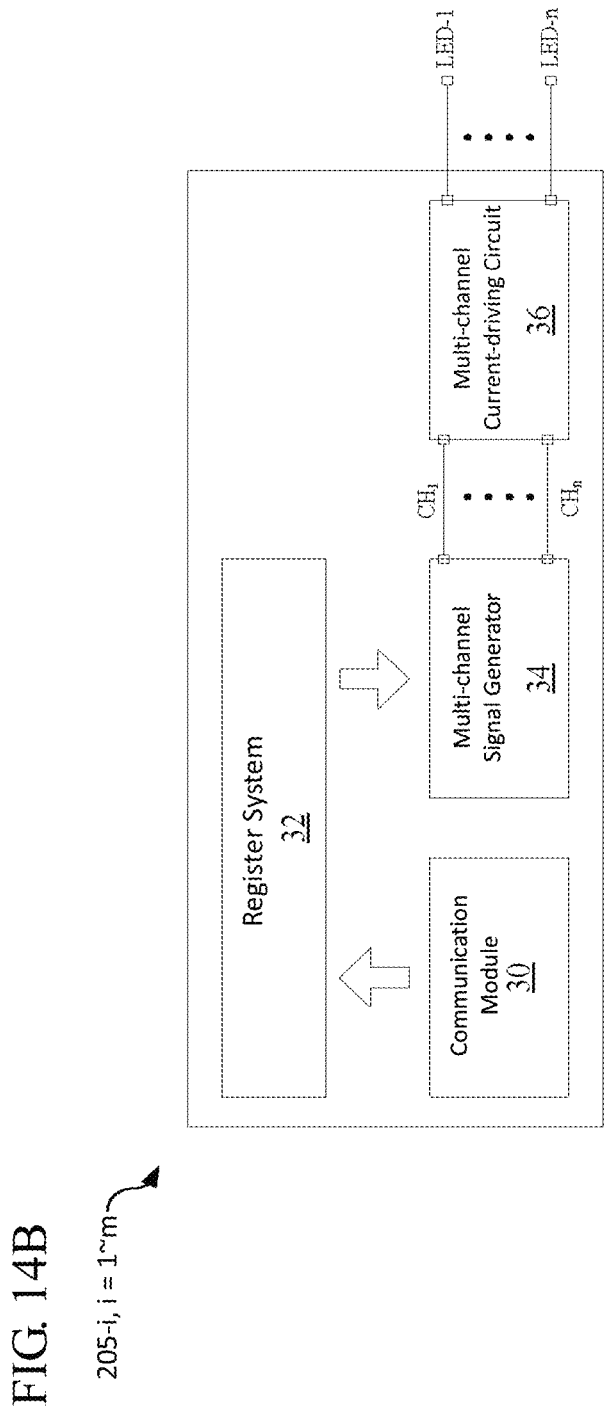

Reference is made to FIG. 13, FIG. 14A and FIG. 14B, wherein FIG. 14A and FIG. 14B illustrate another configuration of a control architecture with electrical power and signal connections among a local-dimming controller module, a distributed local-dimming driver module, and LED light bars in a curved full-array LED backlight module according to some embodiments of the present disclosure. The content shown in FIG. 14A and FIG. 14B is only an example, and is not intended to limit the scope of this patent application.

Functionally, the local-dimming controller module 201 in FIG. 14A is basically the same as the local-dimming controller module 201 in FIG. 12A. Therefore, in the content shown in FIG. 14A, the local-dimming controller module 201 can also be used to generate the target dimming-zone brightness information for each LED dimming zone based upon the pixel brightness information of each of the image zone when triggered by an image synchronization pulse-train signal, and transmit the dimming-zone brightness information in real time to the plurality of distributed local-dimming driver modules 205 (labeled as 205-1 to 205-*m* in FIG. 14A and FIG. 14B). For other details of the local-dimming controller module 201, reference can be made to the above-mentioned local-dimming controller module 201 related to FIG. 12A as described above.

Functionally, the distributed local-dimming driver modules 205-1 to 205-*m* shown in FIG. 14A and FIG. 14B are basically the same as the sub-systems 2031-1~2031-*m* of the centralized local dimming driver module 203 shown in FIG. 12B. Therefore, each of the distributed local dimming driver modules 205-1 to 205-*m* shown in FIG. 14A and FIG. 14B may also include a communication module 30, a register system 32 electrically connected with the communication module 30, a multi-channel signal generator 34 electrically connected with the register system 32, and a multi-channel current-driving circuit 36 electrically connected with the multi-channel signal generator 34. For other details of the register system 32, the multi-channel signal generator 34, and the multi-channel current-driving circuit 36, reference can be made to the above-mentioned local-dimming driver module 203 related to FIG. 12B as described above.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A curved full-array LED light panel, comprising:
a plurality of LED light bars; wherein
each of the plurality of LED light bars comprises a bar-shaped PCB, a plurality of LEDs disposed on a PCB-front side of the bar-shaped PCB, and an electrical circuit;
the plurality of LEDs disposed on the plurality of bar-shaped PCBs form a full array of LEDs;
the electrical circuit on each of the LED light bars further comprises a plurality of dimming-zone circuits; and each dimming-zone circuit is electrically connected with at least one respective LED to adjust luminous intensity of the at least one respective LED;
a main PCB set; wherein, the plurality of LED light bars further comprises a plurality of light-bar connectors respectively disposed on the PCB-front side or the PCB-rear side of the plurality of bar-shaped PCBs of the plurality of LED light bars, so that the plurality of bar-shaped PCBs are electrically connected to the main PCB set through a set of electrical wires; and
the main PCB set includes a local-dimming controller module and a centralized local-dimming driver module or a plurality of distributed local-dimming driver modules; and the local-dimming controller module individually and independently controls the plurality of dimming-zone circuits on the plurality of bar-shaped PCBs of the plurality of LED light bars by commanding a plurality of target current-driving signals to the centralized local-dimming driver module or plurality of distributed local-dimming driver modules, thereby realizing local dimming of the curved full-array LED light panel; and
a flexible reflective sheet including a plurality of first openings corresponding to the positions of the full array of LEDs; wherein,
the plurality of LED light bars are attached to a sheet-rear side of the flexible reflective sheet through an adhesive along a height direction of the flexible reflective sheet, and the plurality of LEDs disposed on the LED light bars are exposed from the plurality of first openings of the flexible reflective sheet; and
the sheet-rear side of the flexible reflective sheet is deformed toward the sheet-front side of the flexible reflective sheet along a width direction of the flexible reflective sheet to form a curved reflective surface of the flexible reflective sheet of the curved full-array LED light panel.

2. The curved full-array LED light panel of claim 1, wherein:
the flexible reflective sheet also includes a plurality of second openings; and
the plurality of LED light bars further include a plurality of film-support pins for an optical film stack, wherein the plurality of film-support pins are disposed on the PCB-front sides of the plurality of bar-shaped PCBs of the plurality of LED light bars, and are exposed from the plurality of second openings of the flexible reflective sheet.

3. The curved full-array LED light panel of claim 2, wherein the plurality of first openings and the plurality of second openings are rectangular openings or circular openings or both.

4. The curved full-array LED light panel of claim 1, wherein the plurality of LEDs of the plurality of LED light bars includes one of the following: blue LEDs, white LEDs, purple LEDs, ultraviolet LEDs, or a combination of red LEDs, green LEDs, and blue LEDs.

5. The curved full-array LED light panel of claim 1, wherein the plurality of LEDs of the plurality of LED light bars are Mini-LEDs.

6. The curved full-array LED light panel of claim 1, wherein the plurality of LEDs of the plurality of LED light bars are arranged in one column or a plurality of columns parallel to one another.

7. The curved full-array LED light panel according to claim 1, wherein:
the plurality of LEDs of the plurality of LED light bars have substantially the same first pitch along the height direction of the flexible reflective sheet; and
the plurality of LEDs of the plurality of LED light bars have substantially the same second pitch along the curved reflective surface of the flexible reflective sheet.

8. The curved full-array LED light panel of claim 7, wherein the ratio between the first pitch and the second pitch is not greater than 2 and not less than 0.5, not greater than 1.5 and not less than 0.6, or not greater than 1.25 and not less than 0.8.

9. The curved full-array LED light panel of claim 1, wherein each bar-shaped PCB of the plurality of bar-shaped PCBs comprises one of the following materials: epoxy resin, bismaleimide triazine resin, aluminum, or polyimide.

10. The curved full-array LED light panel of claim 1, wherein a thickness of the flexible reflective sheet is not greater than 500 microns, not greater than 300 microns, not greater than 200 microns, or not greater than 100 microns.

11. The curved full-array LED light panel of claim 1, wherein a reflectivity of the flexible reflective sheet is not less than 85%, not less than 90%, or not less than 95%.

12. The curved full-array LED light panel of claim 1, wherein the flexible reflective sheet is formed as a curved reflective sheet with a single curvature or a curved reflective sheet with a plurality of curvatures.

13. The curved full-array LED light panel of claim 1, wherein the plurality of LED light bars are attached to a rear frame through a continuous thermally-conductive adhesive tape, or through a plurality of disconnected bar-shaped thermally-conductive adhesive tapes respectively.

14. The curved full-array LED light panel of claim 13, wherein the continuous thermally conductive adhesive tape or the plurality of bar-shaped thermally-conductive adhesive tapes comprise glass fiber fabrics.

15. The curved full-array LED light panel of claim 13, wherein a thermal conductivity of the continuous thermally-conductive adhesive tape or the plurality of bar-shaped thermally-conductive adhesive tapes is not greater than 3.5 W/mK, not greater than 2.5 W/mK, or not greater than 1.5 W/mK.

16. The curved full-array LED light panel of claim 1, comprising the centralized local-dimming driver module.

17. The curved full-array LED light panel of claim 1, comprising the plurality of distributed local-dimming driver modules respectively disposed on the PCB-rear sides of the plurality of bar-shaped PCBs of the plurality of LED light bars wherein, each distributed local-dimming driver module further includes:

a communication module for receiving dimming-zone brightness information from the local-dimming controller module when triggered by an image synchronization pulse-train signal;

a register system electrically connected with the communication module and including a plurality of independent registers, wherein the plurality of independent registers are used to separately store the dimming-zone brightness information when triggered by the image synchronization pulse-train signal, the plurality of independent registers are respectively mapped to a plurality of brightness-data signal ports, and the plurality of brightness-data signal ports are respectively corresponding to the plurality of dimming-zone circuits of the plurality of the bar-shaped PCBs;

a multi-channel signal generator electrically connected with the register system and used for respectively generating a plurality of current-driving signals corresponding to the plurality of dimming-zone circuits according to the dimming-zone brightness information; and a multi-channel current-driving circuit electrically connected with the multi-channel signal generator and used for separately and independently controlling the driving current of the LEDs of each dimming-zone circuit.

18. A curved full-array LED backlight module, comprising:
the curved full-array LED light panel according to claim 1;
an optical film stack disposed on the sheet-front side of the flexible reflective sheet; and
a rear frame for accommodating the curved full-array LED light panel and the optical film stack.

19. The curved full-array LED backlight module of claim 18, wherein the flexible reflective sheet also includes a plurality of second openings;
wherein the plurality of LED light bars further include a plurality of film-support pins, which are disposed on the PCB-front sides of the plurality of bar-shaped PCBs of the plurality of LED light bars, and are exposed from the plurality of second openings of the flexible reflective sheet extending toward an LCD panel; and
wherein the optical film stack is disposed to be in contact with the plurality of film-support pins exposed from the plurality of second openings of the flexible reflective sheet, so that an optical distance is formed between the flexible reflective sheet and the optical film stack.

20. The curved full-array LED backlight module of claim 19, wherein the optical distance is not greater than 40 mm, not greater than 30 mm, not greater than 20 mm, not greater than 10 mm, not greater than 5 mm mm, or not more than 3 mm.

21. The curved full-array LED backlight module of claim 18, wherein the optical film stack comprises a quantum dot enhancement film, a brightness enhancement film, or a diffuser film.

22. The curved full-array LED backlight module of claim 18,
wherein the local-dimming controller module generates target dimming-zone brightness information based upon pixel brightness information of an image zone of an image when triggered by an image synchronization pulse-train signal, wherein the dimming-zone brightness information includes a plurality of dimming-zone brightness grayscale values corresponding to a plurality of LED dimming zones respectively, and the plurality of LED dimming zones respectively correspond to a plurality of LED dimming-zone circuits on the plurality of bar-shaped PCBs of the plurality of LED light bars; and wherein the centralized local-dimming driver module includes a plurality of sub-systems including:

a communication module for receiving dimming-zone brightness information from the local-dimming controller module when triggered by an image synchronization pulse-train signal;

a register system electrically connected with the communication module and including a plurality of independent registers, wherein the plurality of independent registers are used to separately store the dimming-zone brightness information when triggered by the image synchronization pulse-train signal, the plurality of independent registers are respectively mapped to a plurality of brightness-data signal ports, and the plurality of brightness-data signal ports are respectively corresponding to the plurality of dimming-zone circuits of the plurality of the bar-shaped PCBs;

a multi-channel signal generator electrically connected with the register system and used for respectively generating a plurality of current-driving signals corresponding to the plurality of dimming-zone circuits according to the dimming-zone brightness information; and a multi-channel current-driving circuit electrically connected with the multi-channel signal generator and used for separately and independently controlling the driving current of the LEDs of each dimming-zone circuit.

23. The curved full-array LED backlight module of claim 18, wherein the local-dimming controller module generates target dimming-zone brightness information based upon pixel brightness information of an image zone of an image when triggered by an image synchronization pulse-train signal, wherein the dimming-zone brightness information includes a plurality of dimming-zone brightness grayscale values corresponding to a plurality of LED dimming zones respectively, and the plurality of LED dimming zones respectively correspond to a plurality of LED dimming-zone circuits on the plurality of bar-shaped PCBs of the plurality of LED light bars; and the plurality of distributed local-dimming driver modules respectively disposed on the PCB-rear sides of the plurality of bar-shaped PCBs of the plurality of LED light bars, wherein each of the plurality of the distributed local-dimming driver modules further includes a plurality of sub-systems including:

a communication module for receiving dimming-zone brightness information from the local-dimming controller module when triggered by an image synchronization pulsetrain signal;

a register system electrically connected with the communication module and including an independent register, wherein the independent register is used to store the dimming-zone brightness information when triggered by the image synchronization pulse-train signal, the independent register is mapped to a brightness-data signal port, and the brightness-data signal port is corresponding to the plurality of dimming-zone circuits of the bar-shaped PCB;

a multi-channel signal generator electrically connected with the register system and used for respectively generating a plurality of current-driving signals corresponding to the plurality of dimming-zone circuits according to the dimming-zone brightness information; and a multi-channel current-driving circuit electrically connected with the multi-channel signal generator and used for separately and independently controlling the driving current of the LEDs of each dimming-zone circuit.

24. A curved LCD, comprising:

a curved LCD panel;

the curved full-array LED backlight module according to any one of the claims 18 to 23 for providing the light source required for the curved LCD panel; and a front frame for accommodating the curved LCD panel and can be assembled with the rear frame of the curved full-array LED backlight module.

\* \* \* \* \*